(12) United States Patent
Bardwell

(10) Patent No.: US 6,605,548 B1
(45) Date of Patent: Aug. 12, 2003

(54) PROCESS FOR ETCHING GALLIUM NITRIDE COMPOUND BASED SEMICONDUCTORS

(75) Inventor: Jennifer Bardwell, Ottawa (CA)

(73) Assignee: National Research Council of Canada, Ottawa (CA)

(*) Notice: Subject to any disclaimer, the term of this patent is extended or adjusted under 35 U.S.C. 154(b) by 394 days.

(21) Appl. No.: 09/579,497

(22) Filed: May 30, 2000

Related U.S. Application Data

(60) Provisional application No. 60/137,220, filed on Jun. 1, 1999.

(51) Int. Cl.[7] .............................................. H01L 21/302
(52) U.S. Cl. ....................................... 438/745; 438/752
(58) Field of Search ................................. 438/745, 752; 216/2, 65, 67

(56) References Cited

U.S. PATENT DOCUMENTS

| | | | |
|---|---|---|---|
| 5,773,369 A | * | 6/1998 | Hu et al. ...................... 438/746 |
| 5,895,223 A | * | 4/1999 | Peng et al. ................... 438/752 |
| 6,090,300 A | * | 7/2000 | Walker et al. ................. 216/2 |
| 6,294,475 B1 | * | 9/2001 | Schubert et al. ............. 438/749 |

FOREIGN PATENT DOCUMENTS

| | | | | |
|---|---|---|---|---|
| JP | 8-255952 | * | 8/1996 | ............. H01S/3/18 |
| JP | 9-55366 | * | 9/1997 | ......... H01L/21/306 |
| JP | 10-256226 | * | 10/1998 | ......... H01L/21/306 |

OTHER PUBLICATIONS

Peng et al., "Deep Ultraviolet Enhanced Wet Etching of GaN", Applied Physics Letters, 1998, vol. 72, p. 939–941.*

Bardwell et al., "A Simple Wet Etch for GaN", J. of Electronic Materials, 1999, vol. 28, p. L24–L26.*

Hung et al., "Electroluminescene at GaN and GaxInl–xN Electrodes in Aqueous Electrodes", Electrochemical and Solid–State Letters, 1998, vol. 1(3), p. 142–144.*

* cited by examiner

Primary Examiner—Benjamin L. Utech
Assistant Examiner—Duy-Vu Deo

(57) ABSTRACT

A method for wet etching a gallium nitride compound-based semiconductor is disclosed. The method uses an aqueous solution containing an oxidizing agent such as peroxydisulfate ions. The sample and solution are irradiated with visible or ultraviolet light in order to promote the etching.

8 Claims, 2 Drawing Sheets

PROCESS FOR ETCHING GALLIUM NITRIDE COMPOUND BASED SEMICONDUCTORS

This application claims the benefit of Ser. No. 60/137,220 filed Jun. 1, 1999.

FIELD OF THE INVENTION

The present invention relates to a method for etching a gallium nitride compound-based semiconductor. More specifically, the invention relates to a photoenhanced wet etching method for the gallium nitride compound-based semiconductor.

BACKGROUND OF THE INVENTION

Gallium nitride compound-based semiconductors (for example, but not exclusively, $Al_xGa_{1-x}N$, $In_{1-y}Ga_yN$ and GaN or a mixture thereof, where x and y are numbers between zero and one, indicating the mole fraction of Al or In) have been receiving attention as the material for blue light emitting devices, power semiconductor devices and ultraviolet photodetectors. In order to fabricate these devices using the gallium nitride compound-based semiconductors, etching technology must be developed for forming mesa structures and the like. However, gallium nitride compound-based semiconductors are highly stable materials. Therefore, the semiconductors cannot be etched near the room temperature with etchants commonly used to etch other compounds of III–V group, such as hydrochloric acid (HCl), sulfuric acid ($H_2SO_4$), nitric acid ($HNO_3$), hydrofluoric acid (HF), and mixed solutions thereof.

Various methods of wet etching gallium nitride compound-based semiconductors (hereinafter called GaN type semiconductors for brevity) have been reported by other laboratories. These include: a method using a solution obtained by heating sodium hydroxide or potassium hydroxide and the like to a temperature of 800 degrees C. or more; a method using an etchant obtained by heating a mixture of phosphoric and sulfuric acid to a temperature of approximately 200 degrees C.; and the like. However, these methods employ corrosive substances at high temperatures and are not suitable for industrial use. Recently, a photoelectrochemical (PEC) etching technique has been developed, which can produce anisotropic, dopant selective or smooth etching. Moreover, mesas and pillars can be produced.

Unfortunately, PEC etching can, in general, only be used for GaN deposited on a conducting substrate (for example SiC), as the technique requires an electrical contact to be made to the sample. The contact is attached to a Pt cathode which is located remotely from the sample, but also immersed in the water-based solution. Peng et al., Appl. Phys. Lett., 72, 939 (1998), etched GaN on a sapphire (insulating) substrate, but using a specific mask, consisting of stripes of a Ti/Pt bilayer. This metal mask was again connected to a Pt counter electrode immersed in the aqueous solution. Such an arrangement can etch GaN on an insulating substrate, but cannot produce pillars or mesas since the metal mask must be completely interconnected.

Since GaN type semiconductors are often grown on insulating substrates, and since mesas and pillars are required for fabrication of various devices, these methods are limited in practical importance. Moreover, the necessity to make electrical contact to the semiconductor makes the process impractical for industrial use. The mechanism of PEC etching of GaN is thought to consist of the following steps:

1. Absorption of an ultraviolet photon, resulting in the generation of an electron-hole pair in the semiconductor. Alternatively, the electron-hole pair can be formed through thermal activation.
2. The electron ($e^-$) is transported through the sample's electrical contact to the Pt counter electrode located remotely in the solution where the Pt surface is catalytic for the reaction: $H^+ + e^- \rightarrow \frac{1}{2}H_2$
3. The hole ($p^+$) is used to form surface oxide on the GaN in the following reaction: $2GaN + 3OH^- + 6p^+ \rightarrow Ga_2O_3 + N_2 + 3H^+$
4. The surface oxide $Ga_2O_3$ is dissolved into the aqueous solution in the following reaction: $Ga_2O_3 + 3H_2O \rightarrow 2Ga^{3+} + 6OH^-$, where $Ga_2O_3$ is known to be soluble in either acid or alkaline solutions.

Thus, the overall reaction associated with GaN etching is: $GaN \rightarrow Ga^{3+} + \frac{1}{2}N_2$.

Electrons and holes are both produced and consumed during the reaction. Water, and/or its ions, $H^+$ and $OH^-$ are also involved.

SUMMARY OF THE INVENTION

It has been found that gallium nitride compound-based semiconductors can be etched effectively by a method comprising at least the step of applying to the semiconductor an aqueous solution containing an oxidizing agent, the solution and said agent in combination, i.e. jointly, capable of dissolving gallium oxide and consuming electrons generated during etching.

The solution and the semiconductor may be irradiated with light of a wavelength selected from the visible and ultraviolet.

Preferably, the semiconductor is irradiated with light of a frequency above the band gap of the semiconductor.

The oxidizing agent may be peroxydisulfate ions. The solution may be acidic or alkaline, i.e. comprise hydroxide or hydrogen ions.

If the sample is masked by a non-catalytic metal, both the sample and solution may be irradiated with light of wavelength shorter than 260 nm such that free radicals are produced by the photochemical reaction of the peroxydisulfate ions.

The aqueous solution may be purged with an inert gas, such as $N_2$ or Ar, to remove dissolved oxygen before any illumination is provided, and throughout the etching process.

The semiconductor is partially masked during etching with a metal, for example platinum, titanium, gold, or any other metal that is essentially resistant to etching under the gallium nitride compound-based semiconductors etching conditions.

Alternatively, the semiconductor may be partially masked during the etching with a non-metallic material, for example silicon dioxide or silicon nitride, that is essentially chemically inert under the GaN-type semiconductor etching conditions.

The gallium nitride compound-based semiconductor may be one or more of a large array of compounds, for example, but without limiting to, $Al_xGa_{1-x}N$, $In_{1-y}Ga_yN$ and GaN.

BRIEF DESCRIPTION OF THE DRAWINGS

The invention will be explained in more detail by way of the following description to be taken in conjunction with the drawings in which.

DETAILED DESCRIPTION OF THE PRESENT INVENTION

The motivation for the work was to eliminate the necessity for the Pt counter electrode. This has been accomplished by adding an oxidizing agent of sufficient strength to the aqueous solution, so as to locally consume the photo-excited electrons produced by the absorption of the photon, see step 1 above. The requirements of the oxidizing agent are that it should have sufficient oxidizing power and that it be stable in the acid or alkaline solutions needed to dissolve the intermediate $Ga_2O_3$, see step 4 above. Moreover, the reduction products from the oxidizing agent must likewise be soluble. The purpose of the oxidizing agent, Ox, is to replace the reaction in step 2, above, by the following reaction: Ox+e⁻→Red, where Red is the reduction product. This reaction can take place at the etching site, not remotely at a Pt counter electrode.

An example of such a suitable oxidizing agent is peroxidisulfate ion. It also has a particular advantage in that its reduction reaction

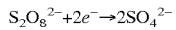

$$S_2O_8^{2-}+2e^-\rightarrow 2SO_4^{2-}$$

is not pH dependent. This means that the pH of the solution can be freely varied (from approx. 1 to approx. 14) so as to optimize the etching.

The samples for this experiment consisted of high quality molecular beam epitaxially (MBE) grown GaN, 2.2 μ thick, with a Hall mobility of 350 cm²/V–s, and a carrier concentration of 9×10¹⁷ cm⁻³. These parameters are given to indicate that the technique can be used to etch even high quality GaN.

The samples were patterned with 100 nm of sputtered Pt using lift-off techniques. The samples were held in a raised dish, with a magnetic stir bar placed below it, and the whole enclosed in a beaker. UV illumination was provided either by a 30 W lamp, filtered for 365 nm (Cole Parmer), which provided a uniform intensity of 1.4 mW/cm², or by an unfiltered 200 W Hg arc lamp, which provided a less laterally uniform light, but with intensities adjustable up to 25 mW/cm² at 365 nm, and 3 mW/cm² at 310 nm. In the latter case, the beaker was contained in a water bath, and the etch times were kept short (<30 min) in order to minimize heating of the solution. The etch solutions were made from deionized water, various concentrations of KOH, with 0.02 M $K_2S_2O_8$ added. Other $K_2S_2O_8$ concentrations were used in subsequent work. The solutions were made up freshly, as peroxydisulfate is subject to slow thermal decomposition. The etch rates were measured using a Dektak-3 surface profiler, and the etched samples characterized using a JEOL 6400-F field emission scanning electron microscope (FE-SEM) and a Digital Nanoscope III atomic force microscope (AFM). Root-mean-square (RMS) roughness was measured by AFM over a 5×5 μm scan, using flatten order zero. The Pt mask was removed by etching in a mixture of 8:7:1 $H_2O$:HCl:$HNO_3$ at 85° C. for 4 min.

Figure 1:
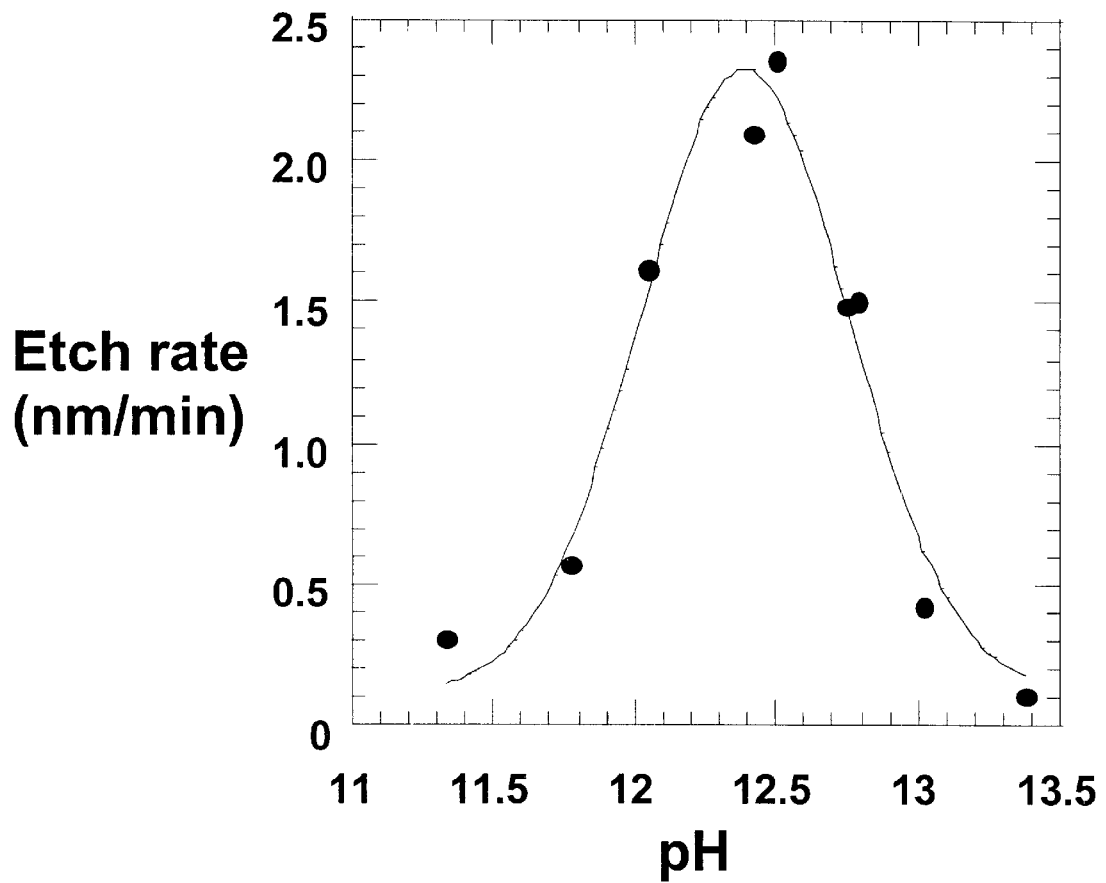
FIG. 1 is a graph of the etch rate of high quality GaN as a function of pH under a light intensity of 1.4 mW/cm² at 365 nm.

As mentioned above, the reduction reaction of peroxydisulfate means that the pH of the solution can be freely varied. FIG. 1 shows the etch rate of the above mentioned GaN as a function of pH for low light intensities. A maximum in the etch rate is obtained at a pH of 12.4. This data was observed under stirred conditions. The light intensity at 365 nm was then varied, using a solution of pH 12.7. The etch rate was observed to increase linearly up to 50 nm/min at 25 mW/cm². No sign of saturation was observed under stirred conditions.

To confirm that the peroxydisulfate is beneficial for the etching reaction, a blank experiment was performed. Conditions were used where an etch rate of 35 nm/min was observed in the presence of 0.02M peroxydisulfate. In the absence of peroxydisulfate, the etch rate was detectable, but greatly reduced to ~2 nm/min. A non-zero etch rate in the absence of peroxydisulfate is expected, as Pt is used as the mask material, and can act as an inefficient cathode under these conditions.

Figure 2:
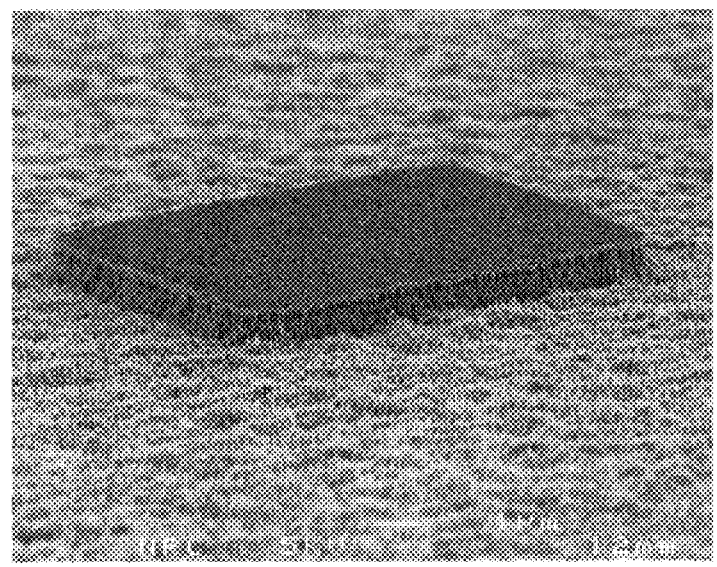
FIG. 2 is a FE-SEM micrograph of a 10 μm×10 μm mesa etched in GaN, the etch solution containing KOH and 0.02M $K_2S_2O_8$, pH 12.7, and stirred during the etching; the Pt mask not removed.

FIG. 2 shows a 10×10 μm mesa etched to a depth of approximately 1 μm under stirred conditions at pH 12.7 and 25 mW/cm². The Pt mask was not removed. The morphology of the etched surface is significantly rougher than the original surface, exhibiting a RMS roughness, as measured by AFM, of 60 nm compared to 10 nm for the original surface. The roughness measurements were taken after the Pt mask was removed. This roughness is similar to that obtained in an earlier work by Youtsey et al., Appl. Phys. Lett. 71, 2151 (1997). In a subsequent work, J. Electron. Matls. 27, 282 (1998), Youtsey et al. were able to obtain smooth etching by varying the etch conditions. Moreover, by varying the etch conditions, we were able to obtain an etched surface roughness of 7 nm for a different sample of GaN.

Figure 3:
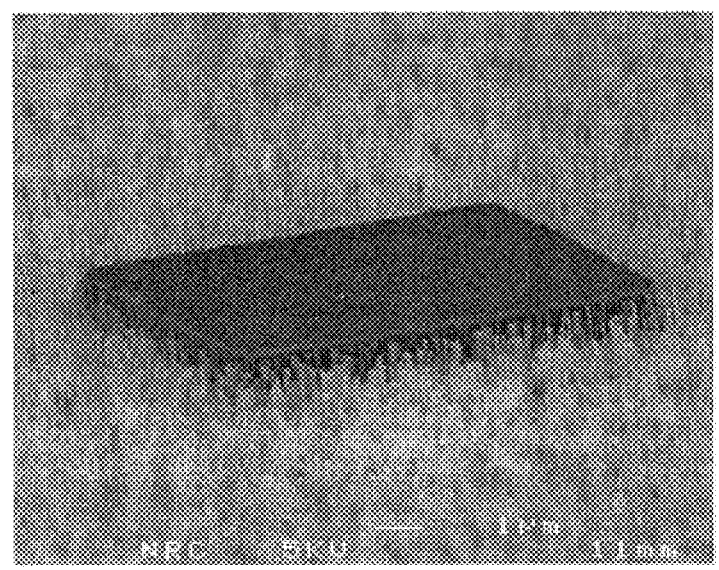
FIG. 3 is a FE-SEM micrograph of a 10 μm×10 μm mesa etched in GaN, with the etch solution as in FIG. 2 but not stirred during the etching, and the Pt mask not removed.

FIG. 3 shows the GaN morphology under the same etching conditions as in FIG. 2, but in the absence of stirring. In this case, the morphology of the etched surface consists of numerous tiny stems or whiskers. The similarity between this morphology and that reported by Youtsey et al., Appl. Phys. Lett. 73, 797 (1998), is very striking. In the present case, the whiskers are intact up to the original GaN surface. By analogy with the previous results of Youtsey et.al., Appl. Phys. Lett. 73, 797 (1998), it is possible that each whisker.represents a dislocation which was present in the original GaN.

It is also possible that the whiskers represent undissolved $Ga_2O_3$, formed in step 3 of the reaction mechanism, see above. In this case, a large amount of O would be detected on the surface using Auger electron spectroscopy. This was not the case; the sample in FIG. 2 showed a surface atomic concentration of ~5% O, consistent with a thin air formed oxide. The sample of FIG. 3 showed ~7% O, which is what would be expected for a thin air formed oxide on a much rougher surface.

We have also investigated the use of other mask materials. GaN can be etched using an $SiO_2$ mask, again using peroxydisulfate as the oxidizing agent in solution. The etch rate was found to be increased when the dissolved oxygen in the solution was removed by bubbling $N_2$ gas through it. Nevertheless, the etch rate was much lower than for samples with the Pt mask. We have used this technique to form the mesa isolation for high performance GaN based MODFETs, see Bardwell et al., J. Vac. Sci. Technol., A, 18, 750 (2000). To the best of our knowledge, this represents the first time that wet etching techniques have been used in device fabrication. This result also shows that AlGaN can be etched by this technique, as the device growth structure included an AlGaN electron donor layer, which was removed in the mesa isolation step.

The etch rate of GaN, $Al_xGa_{1-x}N$ and $In_yGa1_{1-y}N$ and other gallium nitride compound-based semiconductors is expected to depend on such parameters as the doping density, the mobility, the material quality and the material composition, i.e. the value of x in $Al_xGa_{1-x}N$. The optimum etch rate and etch morphology must be individually adjusted for changes in the above mentioned parameters.

The wet etching method for gallium nitride compound-based semiconductors as disclosed herein has one or more of the following advantages over the related art.

Room temperature, or near room temperature solutions are used. The solutions are not highly corrosive. No electrical contact needs to be made to the semiconductor. Structures such as mesas and pillars may be formed on insulating substrates.

What is claimed is:

1. A method for etching a gallium nitride compound-based semiconductor, comprising: applying to the semiconductor an aqueous solution containing an oxidizing agent, the solution and said oxidizing agent in combination capable of dissolving gallium oxide and consuming electrons generated during etching, wherein the oxidizing agent comprises peroxydisulfate ions, the solution comprising hydroxide or hydrogen ions.

2. The method according to claim 1 wherein said solution and said semiconductor are irradiated with light of a wavelength selected from the visible and ultraviolet.

3. The method according to claim 2, wherein the semiconductor is irradiated with light of a frequency above the band gap of the semiconductor.

4. The method according to claim 1, wherein both the sample and solution are irradiated with light of wavelength shorter than 260 nm such that free radicals are produced by the photochemical reaction of the peroxydisulfate ions.

5. The method according to claim 2, wherein the aqueous solution is purged with an inert gas to remove dissolved oxygen before any light illumination is provided, and throughout the etching process.

6. The method according to claim 1, wherein the semiconductor is partially masked with a metal that is essentially resistant to etching under the gallium nitride compound-based semiconductors etching conditions.

7. The method according to claim 1, wherein the semiconductor is partially masked with a non-metallic material that is essentially chemically inert under the gallium nitride compound-based semiconductor etching conditions.

8. The method according to claim 1, wherein the gallium nitride compound-based semiconductor includes at least one of $Al_xGa_{1-x}N$, $In_{1-y}Ga_yN$ and GaN semiconductors.

* * * * *